United States Patent
Hirano

(10) Patent No.: US 8,689,031 B2
(45) Date of Patent: Apr. 1, 2014

(54) SEMICONDUCTOR DEVICE AND POWER SUPPLY CONTROL METHOD OF THE SEMICONDUCTOR DEVICE

(76) Inventor: Ryo Hirano, Tokyo (JP)

( * ) Notice: Subject to any disclaimer, the term of this patent is extended or adjusted under 35 U.S.C. 154(b) by 317 days.

(21) Appl. No.: 13/206,974

(22) Filed: Aug. 10, 2011

(65) Prior Publication Data
US 2012/0042188 A1  Feb. 16, 2012

(30) Foreign Application Priority Data
Aug. 11, 2010  (JP) ................. 2010-180331

(51) Int. Cl.
*G06F 1/00* (2006.01)
*G06F 1/26* (2006.01)
*H01L 25/00* (2006.01)
*H03K 17/00* (2006.01)
*G11C 5/14* (2006.01)

(52) U.S. Cl.
USPC ........... 713/324; 713/320; 713/330; 326/102; 327/365; 365/226

(58) Field of Classification Search
USPC ........... 713/320, 324, 330; 326/102; 327/365; 365/226
See application file for complete search history.

(56) References Cited

U.S. PATENT DOCUMENTS

| 6,384,674 | B2 | 5/2002 | Tanizaki et al. |
| 6,836,175 | B2 * | 12/2004 | Morikawa ...................... 327/534 |
| 6,872,991 | B1 * | 3/2005 | Ngo et al. ...................... 257/207 |
| 7,072,218 | B2 * | 7/2006 | Fujito et al. .............. 365/185.18 |
| 7,952,910 | B2 * | 5/2011 | Lih et al. ........................ 365/154 |
| 8,015,419 | B2 * | 9/2011 | Rowhani et al. .............. 713/300 |
| 2002/0000873 | A1 | 1/2002 | Tanizaki et al. |

FOREIGN PATENT DOCUMENTS

JP  2000-195254 A  7/2000

* cited by examiner

*Primary Examiner* — Stefan Stoynov
(74) *Attorney, Agent, or Firm* — Sughrue Mion, PLLC

(57) ABSTRACT

A semiconductor device includes an internal circuit, a power supply control circuit which controls supply of a power supply to the internal circuit upon receipt of a first control signal, and a control signal generation circuit which outputs the first control signal upon receipt of a second control signal. The control signal generation circuit does not deactivate the first control signal when an inactive period of the second control signal is equal to or less than a first period and deactivates the first control signal when the inactive period of the second control signal is more than the first period.

17 Claims, 10 Drawing Sheets

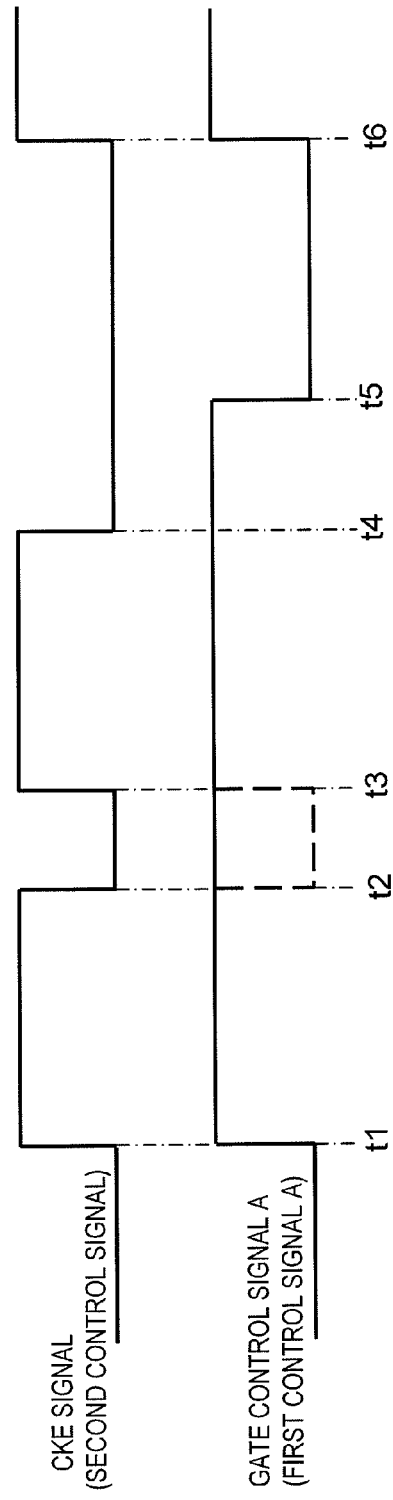

SEMICONDUCTOR DEVICE AND POWER SUPPLY CONTROL METHOD OF THE SEMICONDUCTOR DEVICE

REFERENCE TO RELATED APPLICATION

This application is based upon and claims the benefit of the priority of Japanese patent application No. 2010-180331, filed on Aug. 11, 2010 the disclosure of which is incorporated herein in its entirety by reference thereto.

TECHNICAL FIELD

The present invention relates to a semiconductor device and a power supply control method of the semiconductor device. More specifically, the invention relates to a semiconductor device in which a power supply switch is shut off at a time of standby so as to cause leak current not to flow through an internal circuit, and a power supply control method of the semiconductor device.

BACKGROUND

With development of microfabrication of a transistor, a transistor breakdown voltage is reduced. Accordingly, a power supply voltage of a semiconductor device tends to be reduced. The power supply voltage may also be reduced so as to reduce power consumption of the semiconductor device. In such a case, a threshold value of an MOS transistor used in the semiconductor device needs to be reduced so as to operate the semiconductor device at a high speed and a low power supply voltage. However, reduction of the threshold voltage of the transistor causes a problem of subthreshold current when the transistor is turned off. It has been traditionally considered that, when a clock for a CMOS semiconductor integrated circuit is stopped, consumption current does not flow. However, when the subthreshold current flows, the consumption current flows even if the clock is stopped. In order to cope with this problem, a power gating technology has been extensively used as a technology of reducing subthreshold current especially at a time of standby in which a clock is stopped. In the power gating technology, supply of a power supply to an internal circuit is shut off in a state where an output node potential needed to be held at the time of standby is kept constant.

Patent Document 1 describes a semiconductor device that uses a conventional power gating technology. FIG. 10 is a circuit block diagram showing a configuration of a conventional power gating circuit described in Patent Document 1. The conventional power gating circuit in FIG. 10 comprises a main power supply line MVL connected to a power supply Vdd, a sub power supply line SVL, and a P-channel MOS transistor QHP with a source thereof connected to the main power supply line MVL, a drain thereof connected to the sub power supply line SVL, and a gate thereof connected to a control signal/SCRC. This P-channel MOS transistor QHP functions as a power supply switch which is controlled to turn on/off by the control signal/SCRC. When the P-channel MOS transistor QHP turns on, the sub power supply line SVL is connected to the main power supply line MVL through this power supply switch. A transistor having a large absolute threshold voltage value is employed for the P-channel MOS transistor QHP which functions as this power supply switch in order to reduce subthreshold leak current when the P-channel MOS transistor QHP turns off.

The conventional power gating circuit in FIG. 10 further comprises a main ground line MGL connected to a ground Vss, a sub ground line SGL, and an N-channel MOS transistor QHN with a source thereof connected to the main ground line MGL, a drain thereof connected to the sub ground line SGL, and a gate thereof connected to a control signal SCRC. This N-channel MOS transistor QHN functions as a power supply switch which is controlled to turn on/off by the control signal SCRC. When the N-channel MOS transistor QHN turns on, the sub power supply line SGL is connected to the main power supply line MGL through this power supply switch. A transistor having a large absolute threshold voltage value is employed for the N-channel MOS transistor QHN which functions as this power supply switch in order to reduce subthreshold leak current when the N-channel MOS transistor QHN turns off.

The control signal SCRC and the control signal /SCRC are complementary signals. When the control signal SCRC goes high and the control signal /SCRC goes low, the power supply switches turn on. When the control signal SCRC goes low and the control signal /SCRC goes high, the power supply switches shut off. The control signal SCRC and the control signal /SCRC perform control so that the power supply switches shut off in a standby state and the power supply switches turn on when the standby state is released.

Further, internal circuits 104 and 106 are connected to the sub power supply line SVL and the sub power supply line SGL. The internal circuits are so controlled that, when the power supply switches turn on, a power supply is supplied to the internal circuits through the power supply switches, and when the power supply switches shut off, the supply of the power supply is stopped to cause subthreshold current not to flow.

For the semiconductor device in Patent Document 1, an inter-power supply capacitor cell 102 is further provided. The inter-power supply capacitor cell 102 includes a capacitor SC connected between the sub power supply line SVL and the sub ground line SGL, a capacitor VDC connected between the main power supply line MVL and the sub ground line SGL, and a capacitor VSC connected between the sub power supply line SVL and the main ground line MGL. Patent Document 1 describes that this inter-power supply capacitor cell 102 can reduce a voltage drop in each sub power supply line at the time of consumption of current, thereby allowing stabilization of operation of each internal circuit and improvement of an operation speed of each internal circuit.

[Patent Document 1]
JP Patent Kokai Publication No. JP-P-2000-195254A, which corresponds to US Publication No. US2002/000873A1 and U.S. Pat. No. 6,384,674B2.

SUMMARY

The following analysis is given by the present invention. Power supply leak current caused by subthreshold current can be reduced by controlling the power supply switches to turn off at the time of standby, as in Patent Document 1. However, alternate setting and releasing of a standby state may frequency occur, depending on a system. When a power supply switch is switched to turn on or off for each of the setting and the releasing of the standby state, current necessary for the switching of turning on and off of the power supply switch will increase. Power consumption will thereby increase to the contrary. Thus there is much desired in the art.

According to a first aspect of the present invention there is provided a semiconductor device comprising:
an internal circuit;

a power supply control circuit which controls supply of a power supply to the internal circuit, upon receipt of a first control signal; and a control signal generation circuit which outputs the first control signal, upon receipt of a second control signal. The control signal generation circuit does not deactivate the first control signal when an inactive period of the second control signal is equal to or less than a first period and deactivates the first control signal when the inactive period of the second control signal is more than the first period.

According to a second aspect of the present invention there is provided a semiconductor device comprising:

a plurality of internal circuits;

a plurality of first control signal delay circuits respectively provided for the internal circuits and respectively having different delay amounts, a first control signal being connected to respective inputs of the first control signal delay circuits to be delayed and output; and a plurality of power supply control circuits respectively provided for the internal circuits, each of the power supply control circuits controlling supply of a power supply to a corresponding one of the internal circuits upon receipt of the first control signal delayed by a corresponding one of the first control signal delay circuits. The semiconductor device further comprises a control signal generation circuit which outputs the first control signal upon receipt of a second control signal, the control signal generation circuit not deactivating the first control signal when an inactive period of the second control signal is equal to or less than a first period and deactivating the first control signal when the inactive period of the second control signal is more than the first control period.

According to a third aspect of the present invention there is provided a power supply control method of a semiconductor device, i.e. a method of controlling supply of a power supply to an internal circuit of the semiconductor device based on a power supply control signal, the method comprising:

supplying the power supply to the internal circuit when the power supply control signal is active;

maintaining the supply of the power supply to the internal circuit when an inactive state of the power supply control signal is equal to or less than a certain period of time; and stopping the supply of the power supply to the internal circuit when the inactive state of the power supply control signal continues for more than the certain period of time.

The meritorious effects of the present invention are summarized as follows without limitation thereto. According to the present invention, when a standby period is shorter than the certain period of time, a supply of the power supply to the internal circuit is continued without interruption. With this arrangement, even if alternate setting and releasing of a standby state frequency occurs and a power supply switch is switched to turn on or off for each of the setting and the releasing of the standby state, current caused by the switching of the power supply switch between the conduction and non-conduction states can be reduced.

BRIEF DESCRIPTION OF THE DRAWINGS

FIG. 4 is an operation timing chart of the power supply control unit of the semiconductor device in the first exemplary embodiment;

PREFERRED MODES

Figure 1:
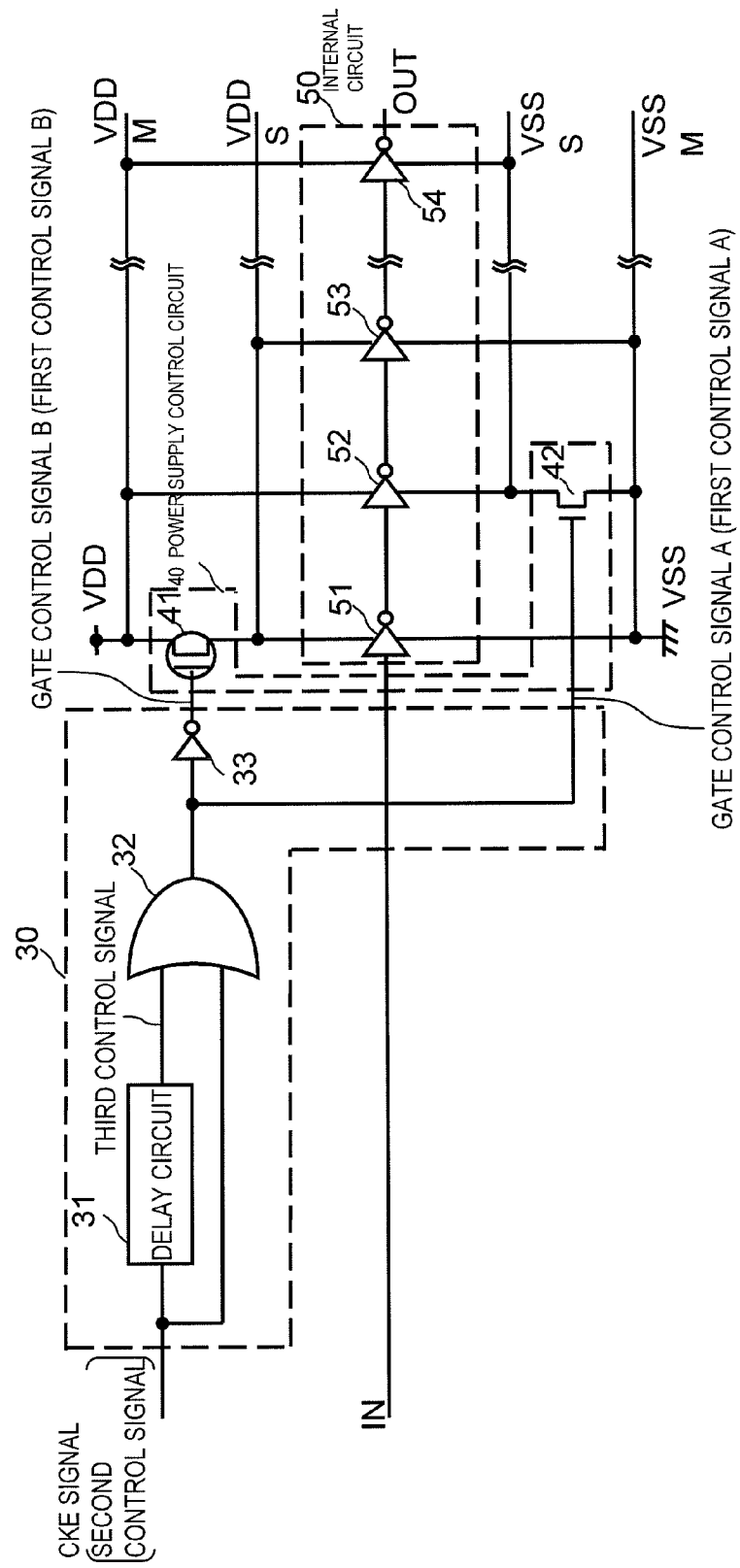
FIG. 1 is a circuit diagram of a power supply control unit of a semiconductor device in a first exemplary embodiment of the present invention.

Overviews of exemplary embodiments of the present invention will be described before each exemplary embodiment of the present invention is described in detail. Any drawing(s) and symbols in the drawings which will be cited in the description of an overview are shown as an example of each exemplary embodiment, and do not thereby limit a variation of the exemplary embodiment of the present invention.

A semiconductor device in one exemplary embodiment of the present invention, as shown in FIG. 1 as an example, includes an internal circuit (50), a power supply control circuit (40) which controls supply of a power supply to the internal circuit upon receipt of a first control signal, and a control signal generation circuit (30) which outputs the first control signal, upon receipt of a second control signal. When an inactive period of the second control signal is equal to or less than a first period, the control signal generation circuit does not deactivate the first control signal. When the inactive period of the second control signal is larger than the first period, the control signal generation circuit deactivates the first control signal.

According to the exemplary embodiment described above, even if control is performed to frequently switch between an active state and an inactive state of the second control signal, power which will be consumed by the power supply control circuit (40) and the internal circuit (50) can be minimized. Generally, when the second control signal is deactivated, operation of the internal circuit is not needed. Thus, by stopping supply of the power supply to the internal circuit, the power supply control circuit can reduce power which will be consumed by the power supply circuit and the internal circuit. However, when control is performed to frequently switch between the active state and the inactive state of the second control signal, consumption current caused by switching of power supply switches (41, 42) included in the power supply control circuit may be larger than a consumption current capable of being reduced by stopping the supply of the power supply to the internal circuit when the second control signal becomes inactive may become larger. For this reason, when the inactive period of the second control signal is less than the first period, the power supply control circuit does not stop the supply of the power supply to the internal circuit, and continues the supply of the power supply. An increase in the power consumption caused by switching of the power supply switches (41, 42) included in the power supply control circuit or the like can be thereby reduced.

The first period can be controlled by a delay period of a delay circuit (31) as shown in FIG. 1, for example.

Figure 7:
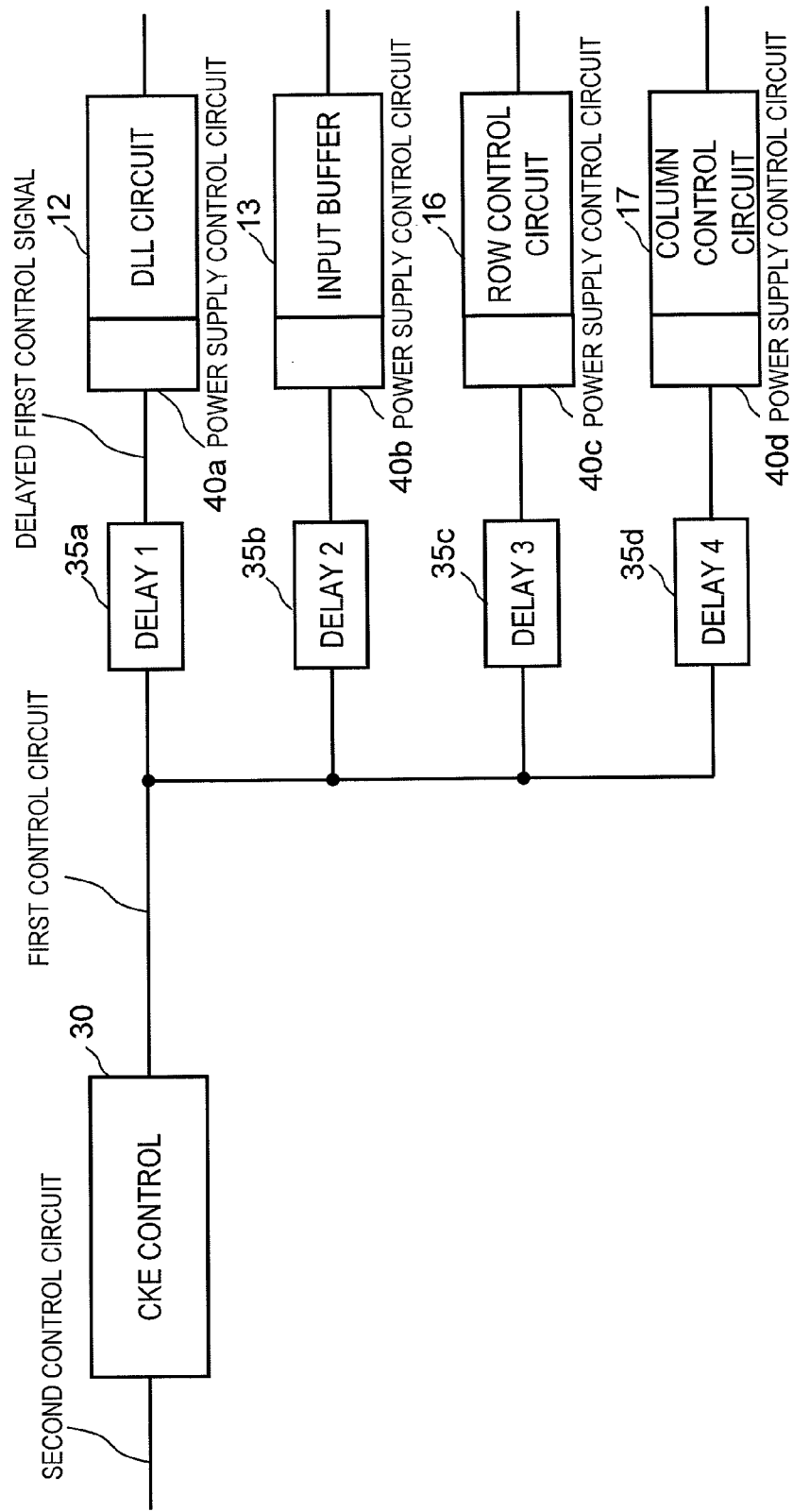
FIG. 7 is a block diagram of a power supply control unit of a semiconductor device in a second exemplary embodiment.

A semiconductor device in one exemplary embodiment of the present invention comprises, as shown in FIG. 7 as an example, a plurality of internal circuits (12, 13, 16, 17), a plurality of first control signal delay circuits (35a to 35d), respectively, provided for the internal circuits and, respectively, having different delay amounts, a plurality of power supply control circuits (40a to 40d), respectively, provided for the internal circuits, and a control signal generation circuit (30). A first control signal is connected to respective inputs of the first control signal delay circuits (35a to 35d) to be delayed and output. Each of the power control circuits (40a to 40d) controls supply of a power supply to a corresponding one of the internal circuits upon receipt of the first control signal delayed by a corresponding one of the first control signal delay circuits. The control signal generation circuit (30) outputs the first control signal upon receipt of a second control signal. When an inactive period of the second control signal is equal to or less than a first period, the control signal generation circuit does not deactivate the first control signal. When the inactive period of the second control signal is larger than the first period, the control signal generation circuit deactivates the first control signal.

According to the above-mentioned exemplary embodiment, each of the power supply control circuits for which the inactive period of the second control signal is less than the first period maintains the supply of the power supply. Accordingly, an increase in power consumption caused by switching of power supply switches included in the power supply control circuit can be reduced. Further, when the first control signal is transitioned from an inactive state to an active state to activate each internal circuit, a timing of transitioning the power supply from a nonconduction state to a conduction state can be shifted for each internal circuit. Thus, power supply noise caused by switching of the power supply switches or the like can be reduced.

Each exemplary embodiment of the present invention will be described below in detail with reference to the drawings.

[First Exemplary Embodiment]

Figure 2:
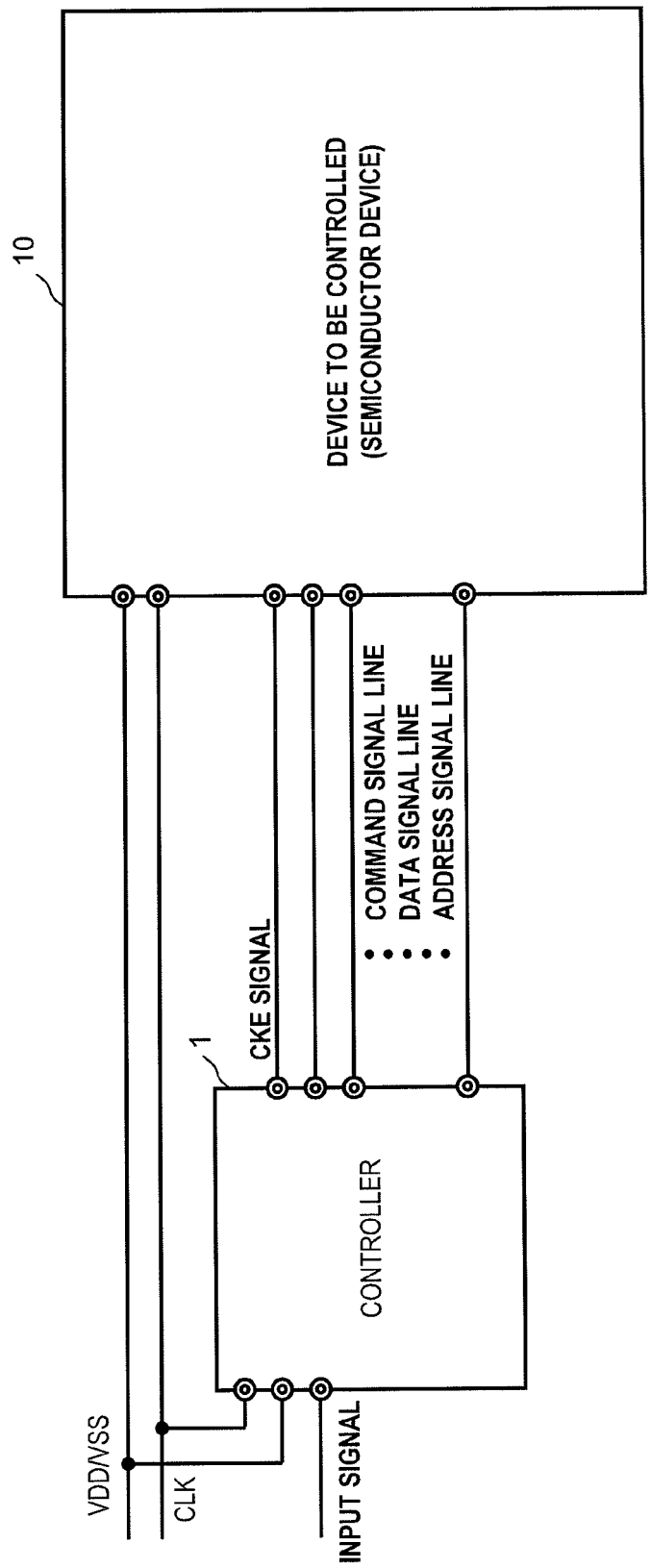
FIG. 2 is a block diagram of an overall system including the semiconductor device in the first exemplary embodiment.

FIG. 2 is a block diagram of an overall system including a semiconductor device in a first exemplary embodiment. Referring to FIG. 2, a controller 1 controls a semiconductor device 10 which is a device to be controlled. In the example in FIG. 2, the controller 1 is a memory controller, and the semiconductor device 10 is a semiconductor memory device such as a DRAM or an SRAM that is controlled by the memory controller. The controller 1 and the semiconductor device 10 are connected to common power supplies VDD and VSS. The power supplies VDD and VSS are provided from a power supply generation unit on the system not shown. The power supply VDD is a power supply having a higher potential than the power supply VSS, and the controller 1 and the semiconductor device 10 receive power from the power supplies VDD and VSS to operate. A common clock signal CLK is supplied to the controller 1 and the semiconductor device 10 from a clock generator on the system not shown. The controller 1 and the semiconductor device 10 operate, in synchronization with this clock signal CLK.

A clock enable signal CKE, which is a signal for controlling a standby operation of the semiconductor device 10, and a plurality of command signal lines/data signal lines/address signal lines are connected between the controller 1 and the semiconductor device 10. The controller 10 controls the semiconductor device 10, in response to an input signal supplied from an outside. Specifically, a read/write operation, for example, is controlled. A signal for controlling an operation of the semiconductor device 10 is given from the controller 1 through a command signal line. An address of the semiconductor device 10 when the read/write operation is performed is given to the semiconductor device 10 from the controller 1 through an address signal line. Further, read data for the read operation is sent to the controller 1 from the semiconductor device 10 through a data signal line, and write data for the write operation is sent to the semiconductor device 10 from the controller 1 through a data signal line.

Supply of a power supply to each internal circuit in the semiconductor device 10 is controlled by the clock enable signal CKE supplied from the controller 1 to the semiconductor device 10. It is not necessary to perform power supply control using the clock enable signal CKE over all internal circuits in the semiconductor device 10. Only an arbitrary portion of the internal circuits necessary for reducing consumption current may be subject to the power supply control. It is because there is also a region into which insertion of a gate circuit according to the present invention cannot be performed due to a layout constraint or the like.

The semiconductor device 10, which is the device to be controlled, for example, can be controlled to be in an active state when the clock enable signal CKE is high, and can be controlled to be in an inactive state when the clock enable signal CKE is low. The inactive state when the clock enable signal CKE is low is generally referred to as a standby state. In the above example, the description was given to the case where the controller 1 is a memory controller and the semiconductor device 10 is a semiconductor memory device, and a signal for controlling the standby state of the semiconductor device 10 is the clock enable signal CKE, as an example. However, any signal other than the clock enable signal CKE that is a signal for controlling the active state and the inactive state of the semiconductor device 10 (signal for controlling the standby state) may be used. A signal for controlling an inactive state of an inside of the controller 1 as well as the inactive state of the device to be controlled may be provided to control the inactive state of all or a part of circuits inside of the controller 1. Alternatively, a signal which is the same as the signal for controlling the inactive state of the device to be controlled such as the clock enable signal CKE may be used to control the inactive state of the circuits inside the controller 1.

Figure 3:
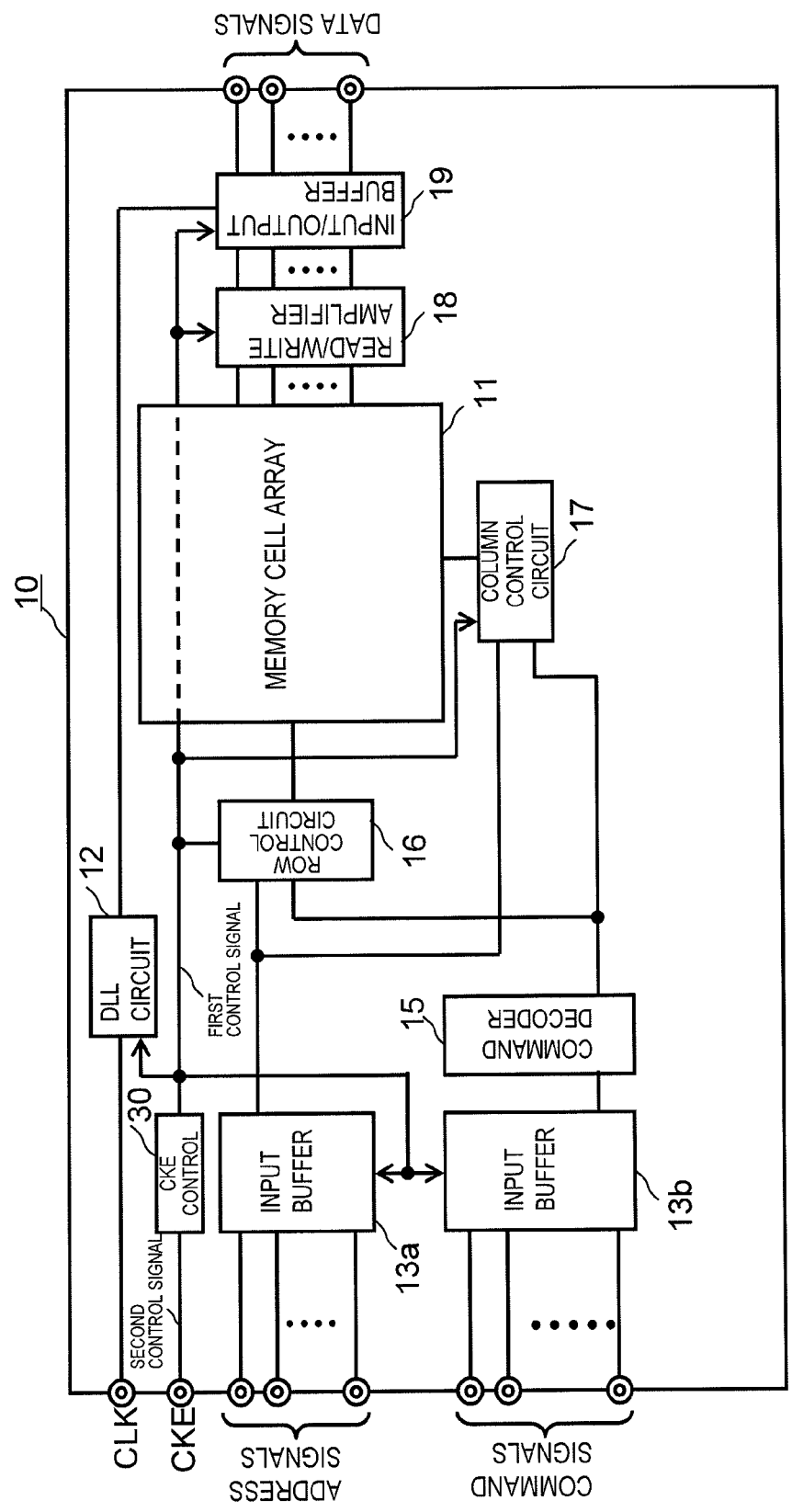
FIG. 3 is a block diagram of an entirety of the semiconductor device in the first exemplary embodiment.

FIG. 3 is a block diagram showing a whole inside of the semiconductor device 10. Herein, a description will be given, using a case where the semiconductor device is the semiconductor memory device such as the DRAM or the SARAM as a preferred example. The semiconductor device 10 may be a semiconductor memory device of a synchronous type which operates in synchronization with a clock signal given from the outside.

An internal configuration of the semiconductor device 10 will be described. The semiconductor device 10 includes input buffers 13a and 13b which respectively receive address signals and command signals sent from the memory controller 1. The command signals received at the input buffer 13b is decoded by a command decoder 15, and controls operation of each circuit inside the semiconductor device 10. The address signals received at the input buffer 13a are connected to a row control circuit 16 and a column control circuit 17, and specify the column address and the row address of the memory cell array 1, based on a command obtained by decoding by the command decoder 15.

A DLL circuit 12 generates an internal clock signal synchronized with the clock signal CLK, and supplies to an input/output buffer 19 a clock signal synchronized with the external clock signal CLK without delay. A read/write amplifier 18 amplifies data read from the memory cell array and transfers the read data to the input/output buffer 19 at a time of a read operation. The read/write amplifier 18 amplifies data sent from the input/output buffer 19 and writes the amplified data to the memory cell array 11 at a time of a write operation.

The input/output buffer 19 outputs the data in the memory cell array 11 read by the read/write amplifier 18 to the outside of the semiconductor device 10 in synchronization with the synchronous clock sent from the DLL circuit, at the time of the read operation. The input/output buffer 19 sends the data supplied from the outside in synchronization with a write command to the read/write amplifier 18 at the time of the read write operation.

The clock enable signal CKE supplied from the outside is connected to a control signal generation circuit (CKE control circuit) 30. The control signal generation circuit 30 outputs a gate control signal (first control signal) for controlling the inactive state (standby state) of each internal circuit, based on the clock enable signal CKE (second control signal). In the example in FIG. 3, the gate control signal is connected to the DLL circuit 12, the row control circuit 16, the column control circuit 17, the read/write amplifier 18, and the input/output buffer 19. The gate control signal controls the inactive state (standby state) of each internal circuit, and controls power supply to each internal circuit.

FIG. 1 is a circuit diagram of a power supply control unit for each internal circuit according to the first exemplary embodiment. Referring to FIG. 1, the control signal generation circuit 30 is the control signal generation circuit (CKE control circuit) 30 in FIG. 3, an internal circuit 50 corresponds to one of the internal circuits among the DLL circuit 12, the row control circuit 16, the column control circuit 17, the read/write amplifier 18, and the input/output buffer 19 in FIG. 3, and a power supply control circuit 40 corresponds to a power supply control circuit which supplies a power supply to the internal circuit.

The control signal generation circuit 30 in FIG. 1 receives the clock enable signal CKE supplied from the outside of the semiconductor device 10 as the second control signal, and outputs the gate control signal to the power supply control circuit 40 as the first control signal.

The control signal generation circuit 30 includes a delay circuit 31, a logic OR circuit 32 that is a combination circuit, and an inverter 33. The delay circuit 31 receives the second control signal, and outputs a third control signal obtained by delaying the second control signal. The logic OR circuit 32 takes a logical sum of the second control signal and the third control signal to output a gate control signal A (first control signal A). The inverter 33 receives the gate control signal A and outputs a gate control signal B (first control signal B) obtained by logically inverting the gate control signal A.

The control signal generation circuit 30 may be a circuit having a circuit configuration other than that shown in FIG. 1 when the following conditions are satisfied. That is, when an inactive period of the second control signal (at a low level in the example in FIG. 1) is equal to or less than a certain period of time (which is set to a first period), the control signal generation circuit 30 does not deactivate the first control signal (the first control signal A maintaining high and the first control signal B maintaining low in the example in FIG. 1).

When the inactive period of the second control signal is larger than the first period, the control signal generation circuit 30 deactivates the first control signal (the first control signal A being low and the first control signal B being high in the example in FIG. 1). The logic OR circuit in particular may be replaced by a logic NOR circuit, a logic AND circuit, or a logic NAND circuit, depending on whether a positive logic is taken or a negative logic is taken.

The power supply control circuit 40 is a circuit provided accompanying the internal circuit 50, for providing power supply to the internal circuit 50. The power supply control circuit 40 in FIG. 1 includes a first power supply switch 41 connecting a first sub power supply line VDDS and a first main power supply line VDDM directly connected to the first power supply VDD and a second power supply switch 42 connecting a second sub power supply line VSSS and a second main power supply line VSSM directly connected to the second power supply VSS.

The first power supply switch 41 is formed of a P-channel MOS transistor with a source thereof connected to the first main power supply line VDDM, a drain thereof connected to the first sub power supply line VDDS, and a gate thereof connected to the first control signal B. Similarly, the second power supply switch 42 is formed of an N-channel MOS transistor with a source thereof connected to the second main power supply line VSSM, a drain thereof connected to the second sub power supply line VSSS, and a gate thereof connected to the first control signal A.

The internal circuit 50 includes four cascoded stages of gate circuits 51 to 54. Referring to FIG. 1, the gate circuits 51 to 54 are inverter circuits. An input signal IN is connected to the inverter circuit 51 in a first stage of the four cascaded stages of the inverter circuits 51 to 54, and an output signal OUT is output from the inverter circuit 54 in a last stage.

The first sub power supply line VDDS and the second main power supply line VSSM are connected to the inverter circuit 51 in the first stage and the inverter circuit 53 in a third stage, as power supply lines. The first main power supply line VDDM and the second sub power supply line VSSS are connected to the inverter circuit 52 in a second stage and the inverter circuit 54 in the fourth stage, as power supply lines.

The reason for such a configuration is that, a logic level of the input signal IN is fixed to be high when the first control signal is deactivated. When the logic level of the input signal IN is fixed to be high, outputs of the inverter circuits 51 and 53 in the first and third stages are fixed to be low, and outputs of the inverter circuits 52 and 54 in the second and fourth stages are fixed to be high.

Since the inverter circuits 51 and 53 are connected to the second main power supply line VSSM, a low level which has a same potential as that of the second main power supply line VSSM can be output even if the power supply switch 41 has turned off and a voltage of the first sub power supply line VDDS becomes indefinite.

Similarly, since the inverter circuits 52 and 54 are connected to the first main power supply line VDDM, a high level which has a same potential as that of the first main power supply line VDDM is output even if the power supply switch 42 has turned off and a voltage of the second sub power supply line VSSS becomes indefinite.

Accordingly, even if the power supply switches 41 and 42 have turned off and potentials of the first sub power supply line VDDS and the second sub power supply line VSSS have become unstable, each of the inverter circuits 51 to 54 outputs a definite logic level, and does not output an unstable intermediate voltage to a gate input in a subsequent one of the stages. Accordingly, occurrence of leak current can be prevented, and the logic of the circuit can be prevented from becoming indefinite.

Next, operation of the power supply control unit of the semiconductor device 10 shown in FIG. 1 will be described using an operation timing chart in FIG. 4. FIG. 4 shows operation timings of the second control signal (clock enable signal CKE) as an input signal to the control signal generation circuit 30 and the first control signal A (gate control signal A) as an output signal of the control signal generation circuit 30.

It is assumed that both of the second control signal and the first control signal A are low and inactive before a timing t1 in FIG. 4. At the timing t1, the second control signal, which is the input signal to the control signal generation circuit 30, rises from the inactive state (low level) to an active state (high level). The gate control signal A also rises simultaneously with the rise of the second control signal to turn on the power supply switches, thereby starting supply of the power supply to the internal circuit.

Next, at a timing t2, the second control signal falls from high to low to be deactivated. The first control signal, however, maintains high (active state).

At a timing t3, the second control signal rises from low to high, thereby returning from the inactive state to the active state. The first control signal A maintains high (active state).

At a timing t4, the second control signal falls from high to low to be deactivated. At this point, however, the first control signal A does not follow the second control signal, and maintains high (active state).

Since the second control signal maintains low (inactive state) for a certain period of time, the first control signal A outputs a low level and therefore becomes the inactive state, following the change to the low level (inactive state) of the second control signal at a timing t5. The power supply switches thus turn off, thereby stopping the supply of the power supply to the internal circuit.

At a timing t6, the second control signal transitions from low (inactive state) to high (active state). The first control signal A is synchronized with this transition without delay, outputs a high level, and therefore becomes active, thereby turning on the power supply switches again.

That is, when the inactive period (period during which the inactive state is maintained after transition from the active state to the inactive state has been made) of the second control signal (clock enable signal CKE) is equal to or less than a predetermined period (which is set to the first period), the first control signal A is controlled to maintain the active state rather than the inactive state. On the other hand, when the period during which the second control signal maintains the inactive state is larger than the first period, the first control signal A is controlled to become inactive, and the power supply switches are controlled to turn off. FIG. 4 shows the timings of the first control signal A as the first control signal for controlling the power supply switches. The first control signal B has logics of the high level and the low level that are opposite to those of the first control signal A. A timing at which the first control signal B becomes active to control the power supply switches to turn on and a timing at which the first control signal B becomes inactive to control the power supply switches to turn off are just the same as those of the first control signal A. The timing at which the first control signal A becomes active and the timing at which the first control signal B becomes inactive are not different.

The reason why the first control signal is not controlled to become inactive when the inactive state of the second control signal is equal to or less than the first period and the first control signal is controlled to become inactive when the inactive period of the second control signal is larger than the first period is as follows.

That is, when the active state and the inactive state of the first control signal are switched, each of the power supply switches 41 and 42 correspondingly switches between the conduction state and the nonconduction state. It is necessary to set each of the power supply switches 41 and 42 to be formed of a transistor having a sufficiently small on resistance in order to supply sufficient current to the internal circuit 50 when each of the power supply switches 41 and 42 turns on. Accordingly, a transistor having a large transistor size or a plurality of transistors connected in parallel may be used for each of the power supply switches 41 and 42. Thus, each of the power supply switches 41 and 42 has a large gate capacitance and a large wiring capacitance, and consumes a certain current when switching between the conduction state and the nonconduction state is performed. Accordingly, when switching between the conduction state and the nonconduction state of the power supply switches is frequently performed, power consumption as a whole can be reduced more when the power supply switches are turned on and are maintained in the conduction states than when the power supply switches are controlled to turn off for each of switching between the conduction and nonconduction states of the power supply switches.

According to a subthreshold current predicted for the internal circuit 50 and a current necessary for switching of each of the power supply switches 41 and 42, it is determined how long the inactive period of the second control signal should be continued before the first control signal becomes inactive. A delay time of the delay circuit 31 should be determined according to the value of this period. As shown in the operation timing chart in FIG. 4, even if the delay time of the delay circuit 31 is increased, deactivation of the internal circuit is just delayed. When the internal circuit is transitioned from the inactive state to an active state, no delay is generated. Thus, no problem arises for operation of the internal circuit.

An optimal period of time taken from deactivation of the second control signal to control of the power supply switches to turn off depends on the leak current predicted for the internal circuit 50 and the switching current of each of the power supply switches, as described above. Thus, it is preferable that the control signal generation circuit provided directly connected to the internal circuit 50 and the power supply control circuit 40 control the optimal period of time.

It is difficult to achieve an optimal control timing for the internal circuit 50 and the power supply control circuit 40 by changing a timing at which the second control signal (chip enable signal CKE) is controlled to be deactivated from the outside of the semiconductor device 10, for example.

Figure 5A:
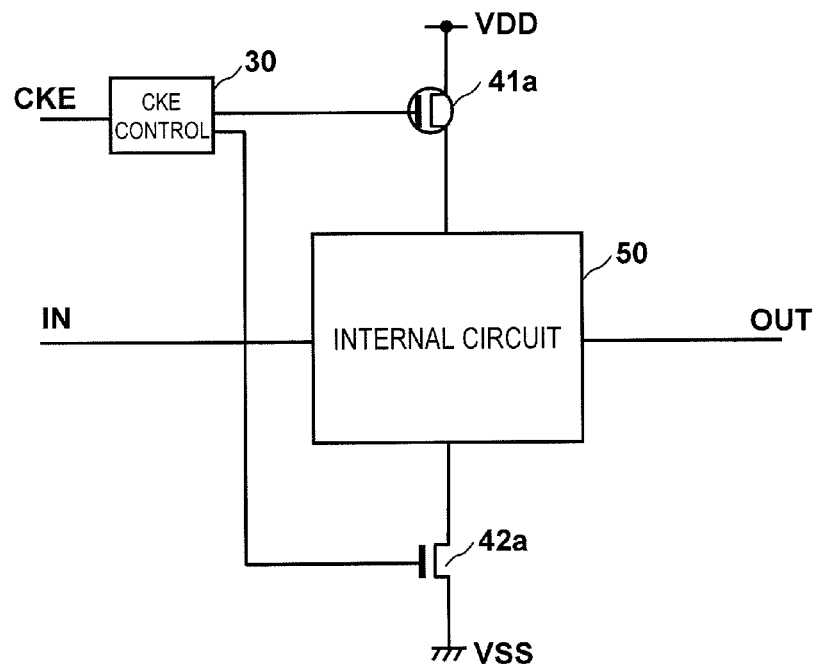
FIG. 5A is a circuit block diagram of a power supply control unit in a first variation example of the first exemplary embodiment.

Next, examples of variation (variations) of the power supply control unit in FIG. 1 will be described. FIG. 5A is a circuit block diagram of a power supply control unit in a first variation example of the first exemplary embodiment. In the first variation example in FIG. 5A, transistors each having a higher absolute value of a threshold value Vt than an MOS transistor used for the internal circuit 50 are used for a P-channel MOS transistor which serves as a power supply switch 41a and an N-channel MOS transistor which serves as a power supply switch 42a. By using the transistors each having the high threshold voltage Vt for the power supply switches, when the power supply switches 41a and 42a are turned off, off-leak current which flows between the first main power supply line VDDM and the second main power supply line VSSM can be reduced.

Figure 5B:
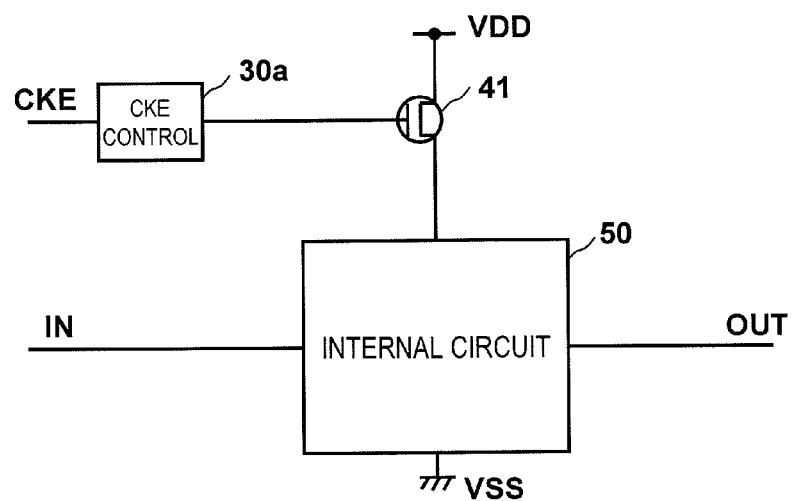
FIG. 5B is a circuit block diagram of a power supply control unit in a second variation example of the first exemplary embodiment.

FIG. 5B is a circuit block diagram of a power supply control unit in a second variation example of the first exemplary embodiment. In the second variation example in FIG. 5B, the second power supply VSS is directly connected to the internal circuit not through the power supply switch. On the other hand, the first power supply VDD supplies a power supply to the internal circuit 50 through the power supply switch 41, as in the first exemplary embodiment 1 shown in FIG. 1.

One of the first power supply VDD and the second power supply VSS may be connected to the internal circuit through the power supply switch, and the other of the power supplies may be directly connected to the internal circuit without intervention of the power supply switch, as shown in FIG. 5B. Though the power supply switch 41 is provided only between the first power supply VDD and the internal circuit 50 in FIG. 5B, the first power supply VDD may be directly connected to the internal circuit 50, and the second power supply VSS may supply a power supply to the internal circuit 50 through the power supply switch 42.

In either case, by turning off only one of the power supplies when the first control signal is in the inactive state, occurrence of leak current can be prevented. According to the second variation example, by providing the power supply switch for only one of the power supplies, the relative layout area can be reduced more than by providing the power supply switch for each of the first power supply VDD and the second power supply VSS.

Figure 6A:
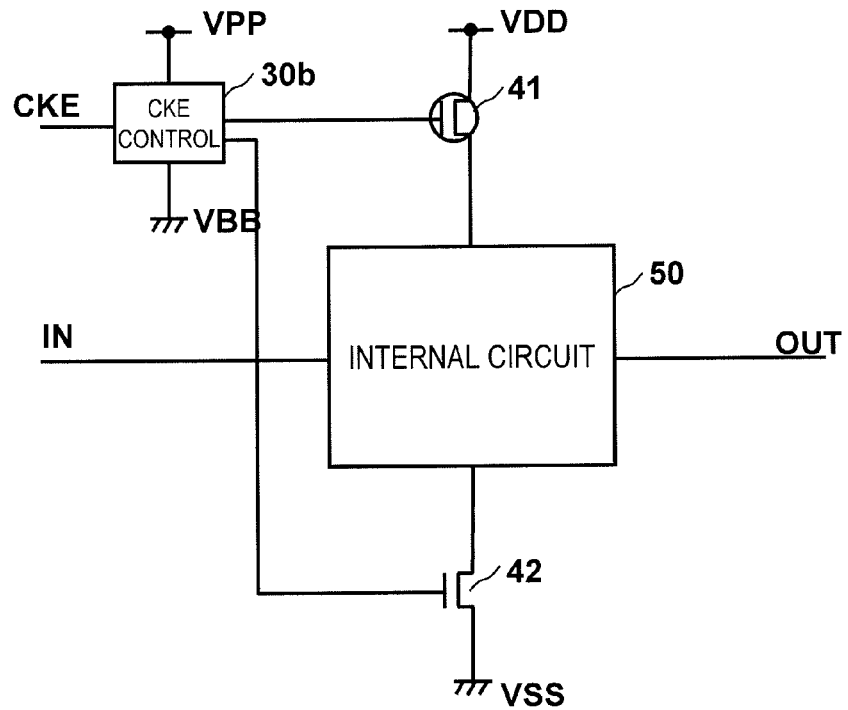
FIG. 6A is a circuit block diagram of a power supply control unit in a third variation example of the first exemplary embodiment.

FIG. 6A is a circuit block diagram of a power supply control unit in a third variation example of the first exemplary embodiment. In the third variation example in FIG. 6A, the power supply system of a control signal generation circuit 30b is different from that of the control signal generation circuit 30 shown in FIG. 1. A power supply VPP of the control signal generation circuit 30b in FIG. 6A is a power supply of a voltage higher than a voltage of the first power supply VDD. Further, a power supply VBB is a power supply of a voltage lower than a voltage of the second power supply VSS. The voltages of these power supplies VPP and VBB can be generated using a step-up circuit and a step-down circuit inside the semiconductor device 10.

Referring to FIG. 6A, when the power supply switch 41 formed of the P-channel MOS transistor is controlled to turn off, a voltage VPP that is higher than a voltage VDD of a source of the P-channel MOS transistor which serves as the power supply switch 41 can be applied to a gate of the P channel MOS transistor. By applying to the gate voltage of the P-channel MOS transistor the voltage that is higher than the voltage of the source of the P channel MOS transistor, off-leak current of the power supply switch can be reduced more.

Similarly, when the power supply switch 42 formed of the N-channel MOS transistor is controlled to turn off, a voltage VBB that is lower than a voltage VSS of a source of the N-channel MOS transistor which serves as the power supply switch 42 can be applied to a gate of the N-channel MOS transistor. By applying to the gate voltage of the N-channel MOS transistor the voltage that is lower than the voltage of the source of the N-channel MOS transistor, off-leak current of the power supply switch can be reduced more.

Figure 6B:
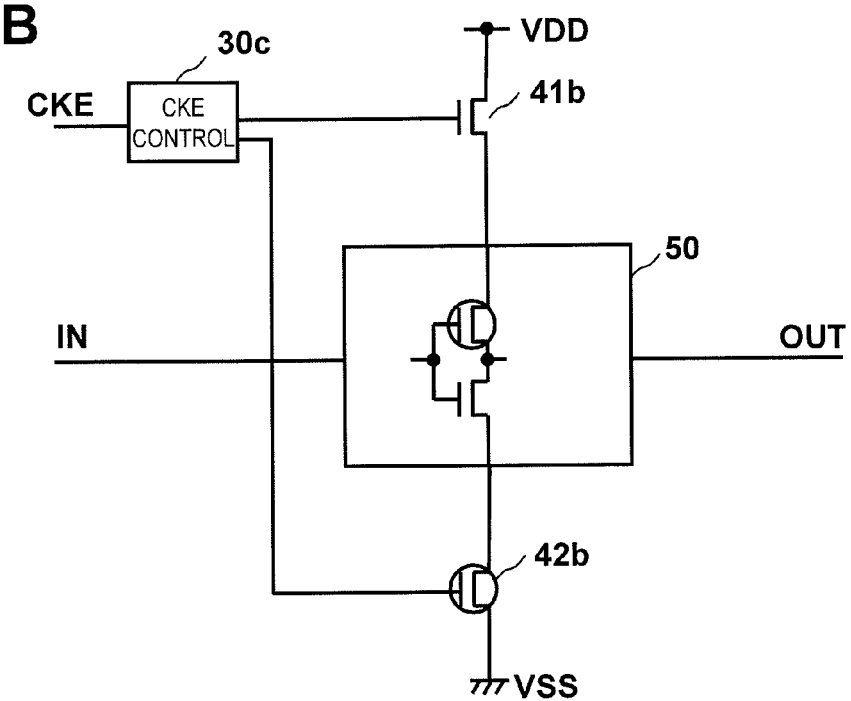
FIG. 6B is a circuit block diagram of a power supply control unit in a fourth variation example of the first exemplary embodiment.

FIG. 6B is a circuit block diagram of a power supply control unit in a fourth variation example of the first exemplary embodiment. In the first exemplary embodiment shown in FIG. 1, the power supply switch 41 which supplies a power supply to the internal circuit 50 from the first power supply VDD is formed of the P-channel MOS transistor. The power supply switch 42 which supplies a power supply to the internal circuit 50 from the second power supply VSS is formed of the N-channel MOS transistor.

In the fourth variation example in the first exemplary embodiment in FIG. 6B, a power supply switch 41b which supplies a power supply to the internal circuit 50 from the first power supply VDD is formed of an N-channel MOS transistor with a drain thereof connected to the first power supply VDD and a source thereof connected to a source of a P-channel MOS transistor of the internal circuit 50.

A power supply switch 42b which supplies a power supply to the internal circuit 50 from the second power supply VSS is formed of a P-channel MOS transistor with a drain thereof connected to the second power supply VSS and a source thereof connected to a source of an N-channel MOS transistor of the internal circuit 50.

That is, the power supply from the first power supply VDD is supplied to the internal circuit 50 through the N-channel MOS transistor with the drain thereof connected to the first power supply VDD and the source thereof source-follower connected to the internal circuit 50. The power supply from the second power supply VSS is supplied to the internal circuit 50 through the P-channel MOS transistor with the drain thereof connected to the second power supply VSS and the source thereof source-follower connected to the internal circuit 50.

With the configuration as described above, when the power supply switches 41b and 42b are controlled to turn off, the voltage lower than the voltage of the source of the NMOS transistor which serves as the power supply switch can be applied to the gate of the NMOS transistor, and the voltage higher than the voltage of the source of the PMOS transistor which serves as the power supply switch can be applied to the gate of the PMOS transistor. Off-leak current which flows through each power supply switch can be reduced.

When the power supply switches 41b and 42b are controlled to turn on, the control voltage generation circuit 30 may apply a voltage higher than the voltage of the first power supply VDD to the gate of the NMOS transistor which serves as the power supply switch 41b and may apply a voltage lower than the voltage of the second power supply VSS to the gate of the PMOS transistor which serves as the power supply switch 42b, in order to reduce on-resistances of the power supply switches.

[Second Exemplary Embodiment]

FIG. 7 is a block diagram of a power supply control unit of a semiconductor device according to a second exemplary embodiment. Referring to FIG. 7, a control signal generation circuit (CKE control circuit) 30 outputs a first control signal upon receipt of a second control signal, as in the first exemplary embodiment. The control signal generation circuit (CKE control circuit) 30 has the same configuration as the control signal generation circuit 30 in the first exemplary embodiment. Accordingly, a detailed description of the control signal generation circuit 30 will be omitted. Referring to FIG. 7, each of a DLL circuit 12, an input buffer 13, a row control circuit 16, and a column control circuit 17 is an internal circuit.

The DLL circuit 12, the input buffer 13, the row control circuit 16, and the column control circuit 17 have the same configurations as those of the DLL circuit 12, the input buffer 13, the row control circuit 16, and the column control circuit 17, respectively, as explained with reference to FIG. 3. An overall configuration of the power supply control unit is also the same as that in FIG. 3 except that the control signal generation circuit (CKE control circuit) 30 is connected to power supply control circuits through delay circuits 35a to 35d, respectively. The delay circuits 35a to 35d are delay circuits respectively having different delay amounts. Each of the delay circuits 35a to 35d delays the first control signal output by the control signal generation circuit (CKE control circuit) 30 and outputs the delayed first control signal.

The power supply control circuits 40a to 40d for controlling respective power supplies to the DLL circuit 12, the input buffer 13, the row control circuit 16, and the column control circuit 17 are provided, respectively corresponding to the DLL circuit 12, the input buffer 13, the row control circuit 16, and the column control circuit 17. Each of the power supply control circuits 40a to 40d has the same configuration as that of the power supply control circuit 40 in the first exemplary embodiment shown in FIG. 1. Accordingly, detailed descriptions of the power supply control circuits 40a to 40d will be omitted.

In the second exemplary embodiment, the first control signal is respectively connected from the control signal generation circuit (CKE control circuit) 30 to the power supply control circuits 40a to 40d through the delay circuits 35a to 35d respectively having the different delay amounts. Accordingly, when the first control signal transitions from an inactive state to an active state, the power supply control circuits 40a to 40d provided corresponding to respective internal circuits (DLL circuit, input buffer, row control circuit, and column control circuit) transition from inactive states to active states, at different timings.

Generally, when a power supply control circuit transitions from an inactive state to an active state, power feeding to an internal circuit is started from a state where supply of a power supply to the internal circuit is stopped. Thus, current flows so as to initially charge a load capacitance and the like of the internal circuit. When the first control signal transitions from the inactive state to the active state, and power feeding is simultaneously started for a lot of the internal circuits, charging is simultaneously started for load capacitances and the like of the lot of internal circuits. Thus, a flow of a large power supply current abruptly occurs, so that power supply noise or the like occurs.

In the second exemplary embodiment, the control signal generation circuit (CKE control circuit) 30 and the power supply control circuits 40a to 40d provided corresponding to the respective internal circuits, are connected through the delay circuits respectively having the different delay amounts. Thus, after the first control signal has transitioned from the inactive state to the active state, the first control signal delayed by the respective delay circuits 35a to 35d for the respective power supply control circuits arrives at different timings, and power feeding is started for the corresponding internal circuits (DLL circuit, input buffer, column control circuit, and row control circuit) at different timings. Accordingly, the occurrence of simultaneous starting of the power feeding for the lot of the internal circuits is prevented. Thus, occurrence of power supply noise caused by an abrupt flow of a large power supply current can be prevented.

The delay amount of each of the delay circuits 35a to 35d is determined in consideration of a timing at which operation of each internal circuit becomes necessary after the second control signal has transitioned to an active state and a period of time needed for starting the operation of each internal circuit. When the semiconductor device is a synchronous-type semiconductor memory device, and the second control signal is a clock enable signal, for example, the delay amount of each delay circuit is determined in consideration of a period of time taken from a timing at which the clock enable signal is activated until a timing at which a subsequent command signal can be received.

The configuration of each of the power supply control circuits 40a to 40d in the second exemplary embodiment is not limited to the same configuration as that of the power supply control circuit 40 in the first exemplary embodiment, and may of course assume the configuration of each of the power supply circuits in the first to fourth variation examples shown in FIGS. 5A, 5B, 6A, and 6B.

[Third Exemplary Embodiment]

Figure 8:
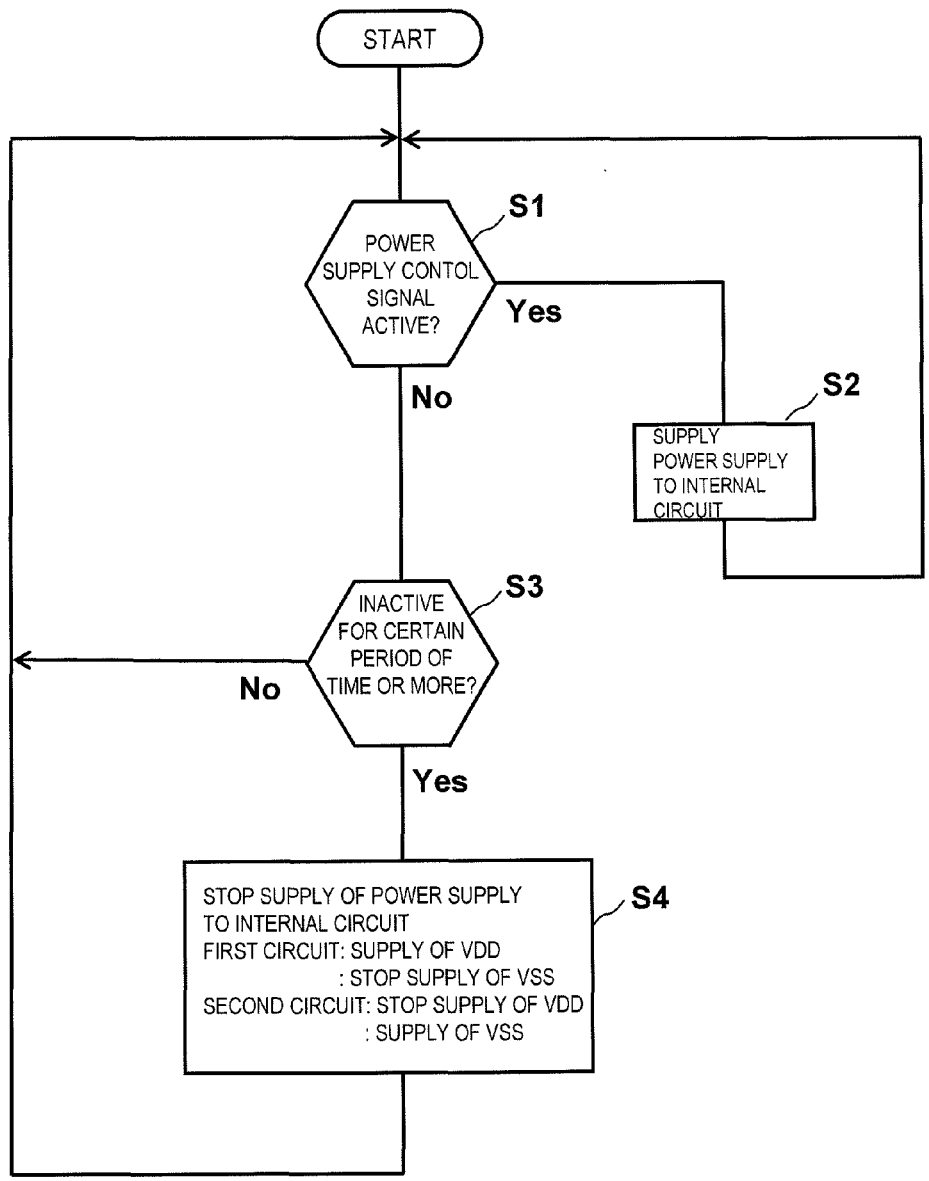
FIG. 8 is a control flowchart of a power supply control method of a semiconductor device in a third exemplary embodiment.

A power supply control method of a semiconductor device according to a third exemplary embodiment will be described. In the third exemplary embodiment, there is provided a method of controlling supply of a power supply to the internal circuit 50 as shown in each of FIGS. 5A, 5B, 6A, and 6B, based on a power supply control signal (CKE signal in each of FIGS. 5A to 6B). Preferably, the power supply control method in the third exemplary embodiment can be applied to the semiconductor device in the first exemplary embodiment as well. FIG. 8 shows a control flowchart of the power supply control method of a semiconductor device according to the third exemplary embodiment.

It is checked in step S1 in FIG. 8 whether or not the power supply control signal CKE indicates an active state. When the power supply control signal CKE indicates the active state, the operation proceeds to step S2. In step S2, the power supply is supplied to the internal circuit, and the operation returns to step S1.

When it is determined in step S1 that the power supply control signal CKE does not indicate the active state, the operation proceeds to step S3. In step S3, it is checked whether or not the power supply control signal CKE indicates an inactive state for a certain period of time or more. When it is determined in step S3 that the power supply control signal CKE does not indicate the inactive state for the certain period of time, the operation returns to step S1. That is, no power supply control is performed in this case.

When it is determined in step S3 that the power supply control signal CKE continues to be in the inactive state for the certain period of time or more, the operation proceeds to step S4. In step S4, supply of the power supply to the internal circuit is stopped. However, supply of the first power supply VDD is continued and supply of the second power supply VSS is stopped for a first circuit of the internal circuit that is necessary for keeping an output node potential thereof to be high even during a period in which the supply of the power supply is stopped. Further, supply of the first power supply VDD is stopped and supply of the second power supply VSS is continued for a second circuit of the internal circuit that is necessary for keeping an output node potential thereof to be low even during the period in which the supply of the power supply is stopped. It is assumed that the high-level potential of the internal circuit is the same as the potential of the first power supply VDD and the low-level potential of the internal circuit is the same as the potential of the second power supply VSS.

When the stop of the supply of the power supply to the internal circuit in step S4 is finished, the operation returns to step S1.

According to the third exemplary embodiment, when the power supply control signal CKE has transitioned from the active state to the inactive state and the inactive state of the power supply control signal CKE is less than the certain period of time, supply of the power supply to the internal circuit is maintained even if the power supply control signal CKE has transitioned to the inactive state. Accordingly, an increase in power consumption of the semiconductor device caused by frequent controls over stop and resumption of supply of the power supply can be reduced.

[Fourth Exemplary Embodiment]

Next, a power supply control method of a semiconductor device in a fourth exemplary embodiment will be described. The fourth exemplary embodiment is a method of controlling supply of a power supply based on a common power supply control signal (second control signal) to a plurality of internal circuits as shown in FIG. 7. Preferably, the fourth exemplary embodiment can be applied to the semiconductor device in the second exemplary embodiment as well. However, the fourth exemplary embodiment also includes a method of collectively controlling a plurality of power supply control circuits at timings that are different for the respective internal circuits, using the control signal generation circuit (CKE control circuit) 30, without providing the delay circuits (35a to 35d) for the respective internal circuits as in the second exemplary embodiment shown in FIG. 7.

Figure 9:
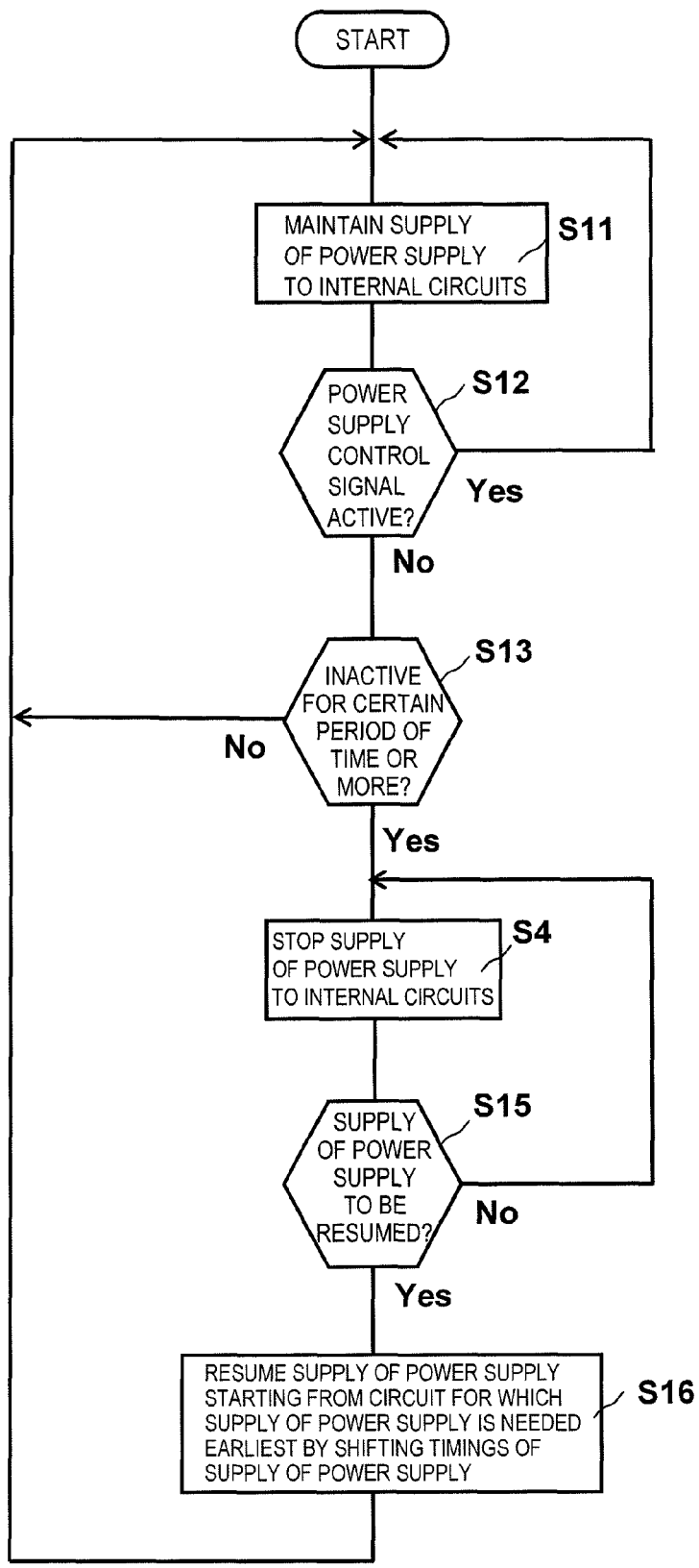
FIG. 9 is a control flowchart of a power supply control method of a semiconductor device in a fourth exemplary embodiment.
Figure 10:
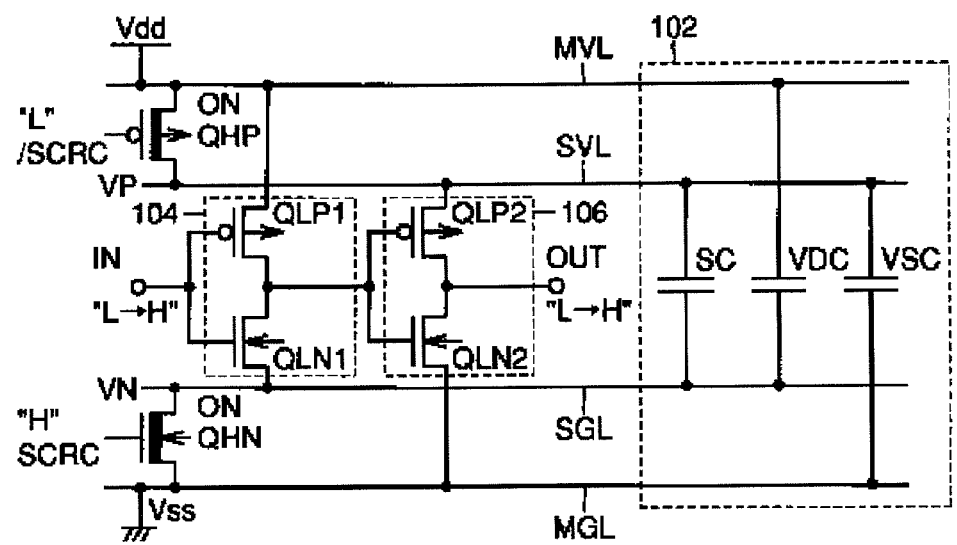
FIG. 10 is a circuit block diagram of a related art power gating circuit described in Patent Document 1.

FIG. 9 is a control flowchart of the power supply control method of a semiconductor device in the fourth exemplary embodiment. It is assumed that in the control flowchart shown in FIG. 9, the power supply is supplied to the internal circuits at a start of the operation. In step S11, the supply of the power supply to the internal circuits is maintained.

Next, it is checked in step S12 whether or not a power supply control signal is active. The power supply control signal is a signal for commonly controlling active and inactive states of the internal circuits, like the second control signal in the second exemplary embodiment. When it is determined to be Yes in step S12, the operation returns to step S11. When it is determined to be No in step S12, the operation proceeds to step S13.

In step S13, it is checked whether or not the power supply control signal is inactive for a certain period of time or more. When it is determined to be No in step S13, the operation returns to step S11. When it is determined to be Yes in step S13, the operation proceeds to step S4.

In step S4, the supply of the power supply to the internal circuits is stopped. Control in step S4 is the same as the control in step S4 in the third exemplary embodiment shown in FIG. 8. That is, supply of the first power supply VDD is continued and supply of the second power supply VSS is stopped for a first gate circuit included in each internal circuit which is necessary for keeping an output node potential thereof to be high even during a period in which the supply of the power supply is stopped. Further, supply of the first power supply VDD is stopped and supply of the second power supply VSS is continued for a second gate circuit included in the internal circuit which is necessary for keeping an output node potential thereof to be low even during the period in which the supply of the power supply is stopped. When the control in step S4 is completed, the operation proceeds to step S15.

In step S15, it is checked whether the power supply control signal has transitioned from the inactive state to the active state, and it is checked whether or not the supply of the power supply to the internal circuits needs to be resumed. When the power supply control signal has not transitioned from the inactive state to the active state, it is determined to be No. Then, the operation returns to step S4, thereby maintaining a state where the supply of the power supply is stopped.

When it is determined that the power supply control signal has transitioned from the inactive state to the active state and it is determined to be Yes in step S15, the operation proceeds to step S16. In step S16, resumption of the supply of the power supply to the respective internal circuits is controlled (performed). Since, when power feeding to the internal circuits be simultaneously resumed, a flow of a large current abruptly occurs, timings of the supply of the power supply are shifted, thereby resuming the supply of the power supply sequentially in the order from one of the internal circuits for which resumption of the supply of the power supply is needed earliest, in view of a period of time needed for starting operation of each internal circuit and a timing at which the operation of each internal circuit first becomes necessary. Resumption of the supply of the power supply for the respective internal circuits by shifting the timings of the supply of the power supply is performed to prevent occurrence of power supply noise or the like caused by simultaneous resumption of the supply of the power supply to the internal circuits and a resulting temporary flow of a large power supply current at a specific point of time. When resumption of the supply of the power supply in step S16 is completed, the operation returns to the initial step S11, and the processes are continued.

According to the fourth exemplary embodiment, when the supply of the power supply to the internal circuits is resumed, timings of the supply of the power supply are shifted, thereby sequentially resuming the supply of the power supply in the order from one of the internal circuits for which the power supply is needed earliest. Thus, in addition to the effect of the third exemplary embodiment, occurrence of power supply noise caused by a flow of a large current at the time of resumption of the supply of the power supply can be prevented.

In the above-mentioned exemplary embodiments, the description has been mainly given using the semiconductor memory device as an example of each preferred exemplary embodiment of the semiconductor device. The present invention, however, can be applied to the semiconductor device as well other than the semiconductor memory device.

Modifications and adjustments of the exemplary embodiments and examples are possible within the scope of the overall disclosure (including claims) of the present invention, and based on the basic technical concept of the invention. Various combinations and selections of various disclosed elements are possible within the scope of the claims and the entire disclosure of the present invention. That is, the present invention of course includes various variations and modifications that could be made by those skilled in the art according to the overall disclosure including the claims and the technical concept.

According to the present disclosure, the following modes are possible without limitation thereto.

(Mode 1)
A semiconductor device as set forth as the first aspect.
(Mode 2)
The semiconductor device according to mode 1, wherein
the control signal generation circuit includes:
a delay circuit which delays the second control signal, thereby generating a third control signal; and
a combination circuit which activates the first control signal when one of the second control signal and the third control signal is active and deactivates the first control signal when both of the second control signal and the third control signal are inactive.
(Mode 3)
The semiconductor device according to mode 1 or 2, wherein
the power supply control circuit comprises a first power supply switch connected between a first power supply and the internal circuit and controlled to turn on or off by the first control signal, and supplies the first power supply to the internal circuit through the first power supply switch.
(Mode 4)
The semiconductor device according to mode 3, wherein
the first power supply switch comprises a first field effect transistor of a first conductivity with a source thereof connected to the first power supply, a drain thereof connected to the internal circuit, and a gate thereof connected to the first control signal; and the control signal generation circuit outputs a voltage having an absolute value higher than a voltage of the first power supply so that the first field effect transistor is sufficiently turned off when the first control signal is in an inactive state.
(Mode 5)
The semiconductor device according to mode 3, wherein
the internal circuit comprises:
a CMOS transistor circuit including an MOS transistor of a first conductivity and an second conductivity type MOS transistor of a conductivity opposite to the first conductivity; and
the first power supply switch comprises the second conductivity MOS transistor which is source-follower connected, with a drain thereof connected to the first power supply, a source thereof connected to a source of the MOS transistor of the first conductivity of the CMOS transistor circuit, and a gate thereof controlled to turn on or off by the first control signal.
(Mode 6)
The semiconductor device according to mode 1 or 2, wherein
the power supply control circuit comprises:
a first power supply switch connected between a first power supply and the internal circuit; and
a second power supply switch connected between a second power supply and the internal circuit;
both of the first and second power supply switches are controlled to turn on or off by the first control signal; and
when the first control signal is activated, the first power supply is supplied to the internal circuit through the first power supply switch and the second power supply is supplied to the internal circuit through the second power supply switch.
(Mode 7)
The semiconductor device according to mode 6, wherein
the internal circuit comprises:
a first gate circuit to which the first power supply is directly supplied without intervention of the first power supply switch and the second power supply is supplied through the second power supply switch when the first control signal is active, an output node potential the first gate circuit being fixed to a potential that is the same as a potential of the first power supply when the first control signal is inactive; and
a second gate circuit to which the first power supply is supplied through the first power supply switch and the second power supply is directly supplied without intervention of the second power supply switch when the first control signal is active, an output node potential of the second gate circuit being fixed to a potential that is the same as a potential of the second power supply when the first control signal is inactive.
(Mode 8)
The semiconductor device according to mode 6 or 7, wherein
the first power supply switch comprises a PMOS power supply switch transistor with a source thereof connected to the first power supply and a drain thereof connected to the internal circuit;
the second power supply switch comprises an NMOS power supply switch transistor with a source thereof connected to the second power supply and a drain thereof connected to the internal circuit;
the first control signal includes a first gate control signal connected to a gate of the PMOS power supply switch transistor and a second gate control signal connected to a gate of the NMOS power supply switch transistor; and
the control signal generation circuit outputs a voltage higher than a voltage of the first power supply as the first gate control signal and outputs a voltage lower than a voltage of the second power supply as the second gate control signal when the first control signal becomes inactive.
(Mode 9)
The semiconductor device according to mode 6 or 7, wherein
the first power supply outputs a higher voltage than the second power supply;
the first power supply switch comprises an NMOS power supply switch transistor with a drain thereof connected to the first power supply and a source thereof connected to the internal circuit;
the second power supply switch comprises a PMOS power supply switch transistor with a drain thereof connected to the second power supply and a source thereof connected to the internal circuit;
the first control signal includes a first gate control signal connected to a gate of the NMOS power supply switch transistor and a second gate control signal connected to a gate of the PMOS power supply switch transistor; and
the control signal generation circuit outputs the first gate control signal as a signal having a same potential as the second power supply and outputs the second gate control signal as a signal having a same potential as the first power supply when the first control signal becomes inactive; and
when the first control signal becomes active, the control signal generation circuit outputs the first gate control signal as a signal having a voltage not less than a voltage of the first power supply and outputs the second gate control signal as a signal having a voltage not more than a voltage of the second power supply.
(Mode 10)
A semiconductor device as set forth as the second mode.
(Mode 11)
The semiconductor device according to mode 10, wherein
the control signal generation circuit includes:
a delay circuit which delays the second control signal, thereby generating a third control signal; and
a combination circuit which activates the first control signal when one of the second control signal and the third control signal is active and deactivates the first control signal when both of the second control signal and the third control signal are inactive.
(Mode 12)
The semiconductor device according to mode 10 or 11, further comprising:
a memory cell array;
a row control circuit of the memory cell array;
a column control circuit of the memory cell array;
a DLL circuit which at least controls an output timing of data read from the memory cell array; and
an input buffer circuit which receives an address signal for the memory cell array and a command signal for controlling an operation of the memory cell array;
the internal circuits including the input buffer circuit, the DLL circuit, the row control circuit, and the column control circuit;
the first control signal delay circuits and the power supply control circuits respectively being provided corresponding to the input buffer circuit, the DLL circuit, the row control circuit, and the column control circuit, the input buffer circuit, the DLL circuit, the row control circuit, and the column control circuit being configured not to simultaneously transition to active states and transition to the active states being time shifted by the first control signal delay circuits respectively having the different delay amounts when the first control signal transitions from the inactive state to an active state.
(Mode 13)

The semiconductor device according to any one of modes 1 to 12, wherein
the semiconductor device is a synchronous type semiconductor memory device, and the second control signal is a clock enable signal which controls a standby state of the semiconductor memory device from an outside.
(Mode 14)
A power supply control method of a semiconductor device as set forth the third aspect.
(Mode 15)
The power supply control method according to mode 14, wherein
when the power supply control signal transitions to an active state after the inactive state of the power supply control signal has maintained for the certain period of time or more followed by stopping the supply of the power supply to the internal circuit, the supply of the power supply to the internal circuit is resumed.
(Mode 16)
The power supply control method according to mode 14 or 15, wherein
the internal circuit includes a first circuit and a second circuit to both of which a first power supply and a second power supply are supplied when the power supply control signal is active; and
when the inactive state of the power supply control signal continues for the certain period of time or more, supply of the second power supply to the first circuit is stopped and supply of the first power supply to the first circuit is maintained, thereby maintaining an output node of the first circuit to have a same voltage as the first power supply, and supply of the first power supply to the second circuit is stopped and supply of the second power supply to the second circuit is maintained, thereby maintaining an output node of the second circuit to have a same voltage as the second power supply.
(Mode 17)
The power supply control method according to any one of modes 14 to 16, wherein
the internal circuit includes a plurality of internal circuits, and when the power supply control signal transitions to from the inactive state to the active state and the supply of the power supply to the internal circuits is resumed after the inactive state of the power supply control signal has maintained for the certain period of time or more and the supply of the power supply to the internal circuits has been then stopped, the supply of the power supply is resumed, being time shifted with respect to the internal circuits, respectively.

What is claimed is:
1. A semiconductor device comprising:
an internal circuit;
a power supply control circuit which controls supply of a power supply to the internal circuit, upon receipt of a first control signal; and
a control signal generation circuit which outputs the first control signal, upon receipt of a second control signal; wherein
the control signal generation circuit does not deactivate the first control signal when an inactive period of the second control signal is equal to or less than a first period and deactivates the first control signal when the inactive period of the second control signal is more than the first period.
2. The semiconductor device according to claim 1, wherein the control signal generation circuit includes:
a delay circuit which delays the second control signal, thereby generating a third control signal; and
a combination circuit which activates the first control signal when one of the second control signal and the third control signal is active and deactivates the first control signal when both of the second control signal and the third control signal are inactive.
3. The semiconductor device according to claim 1, wherein the power supply control circuit comprises a first power supply switch connected between a first power supply and the internal circuit and controlled to turn on or off by the first control signal, and supplies the first power supply to the internal circuit through the first power supply switch.
4. The semiconductor device according to claim 3, wherein the first power supply switch comprises a first field effect transistor of a first conductivity with a source thereof connected to the first power supply, a drain thereof connected to the internal circuit, and a gate thereof connected to the first control signal; and
the control signal generation circuit outputs a voltage having an absolute value higher than a voltage of the first power supply so that the first field effect transistor is sufficiently turned off when the first control signal is in an inactive state.
5. The semiconductor device according to claim 3, wherein the internal circuit comprises:
a CMOS transistor circuit including an MOS transistor of a first conductivity and an second conductivity type MOS transistor of a conductivity opposite to the first conductivity; and
the first power supply switch comprises the second conductivity MOS transistor which is source-follower connected, with a drain thereof connected to the first power supply, a source thereof connected to a source of the MOS transistor of the first conductivity of the CMOS transistor circuit, and a gate thereof controlled to turn on or off by the first control signal.
6. The semiconductor device according to claim 1, wherein the power supply control circuit comprises:
a first power supply switch connected between a first power supply and the internal circuit; and
a second power supply switch connected between a second power supply and the internal circuit;
both of the first and second power supply switches are controlled to turn on or off by the first control signal; and
when the first control signal is activated, the first power supply is supplied to the internal circuit through the first power supply switch and the second power supply is supplied to the internal circuit through the second power supply switch.
7. The semiconductor device according to claim 6, wherein the internal circuit comprises:
a first gate circuit to which the first power supply is directly supplied without intervention of the first power supply switch and the second power supply is supplied through the second power supply switch when the first control signal is active, an output node potential the first gate circuit being fixed to a potential that is the same as a potential of the first power supply when the first control signal is inactive; and
a second gate circuit to which the first power supply is supplied through the first power supply switch and the second power supply is directly supplied without intervention of the second power supply switch when the first control signal is active, an output node potential of the second gate circuit being fixed to a potential that is the same as a potential of the second power supply when the first control signal is inactive.

8. The semiconductor device according to claim 6, wherein
the first power supply switch comprises a PMOS power supply switch transistor with a source thereof connected to the first power supply and a drain thereof connected to the internal circuit;
the second power supply switch comprises an NMOS power supply switch transistor with a source thereof connected to the second power supply and a drain thereof connected to the internal circuit;
the first control signal includes a first gate control signal connected to a gate of the PMOS power supply switch transistor and a second gate control signal connected to a gate of the NMOS power supply switch transistor; and
the control signal generation circuit outputs a voltage higher than a voltage of the first power supply as the first gate control signal and outputs a voltage lower than a voltage of the second power supply as the second gate control signal when the first control signal becomes inactive.

9. The semiconductor device according to claim 6, wherein
the first power supply outputs a higher voltage than the second power supply;
the first power supply switch comprises an NMOS power supply switch transistor with a drain thereof connected to the first power supply and a source thereof connected to the internal circuit;
the second power supply switch comprises a PMOS power supply switch transistor with a drain thereof connected to the second power supply and a source thereof connected to the internal circuit;
the first control signal includes a first gate control signal connected to a gate of the NMOS power supply switch transistor and a second gate control signal connected to a gate of the PMOS power supply switch transistor; and
the control signal generation circuit outputs the first gate control signal as a signal having a same potential as the second power supply and outputs the second gate control signal as a signal having a same potential as the first power supply when the first control signal becomes inactive; and
when the first control signal becomes active, the control signal generation circuit outputs the first gate control signal as a signal having a voltage not less than a voltage of the first power supply and outputs the second gate control signal as a signal having a voltage not more than a voltage of the second power supply.

10. A semiconductor device comprising:
an internal circuit;
a power supply terminal supplied with a power supply voltage; and
a power supply control circuit provided between the power supply terminal and the internal circuit, and receiving a control signal, the control signal changing from an active state to an inactive state, and then returning from the inactive state to the active state;
the power supply control circuit keeping an electrical connection between the power supply terminal and the internal circuit when the control signal is in the active state, maintaining the electrical connection when a period from the changing to the returning is equal to or shorter than a predetermined period, and cutting off the electrical connection when the period from the changing to the returning is longer than the predetermined period.

11. The semiconductor device according to claim 10, further comprising an external terminal receiving a clock enable signal from outside of the semiconductor device, the control signal changing from the active state to the inactive state when the clock enable signal changes from the active state to the inactive state, and returning from the inactive state to the active state when the clock enable signal returns from the inactive state to the active state.

12. The semiconductor device according to claim 10, wherein the power supply control circuit includes:
a delay circuit delaying the control signal to produce a first signal;
a logic circuit receiving the control signal and the first signal, and outputting a second signal, the second signal taking an active state when at least one of the control signal and the first signal is in the active state, and taking an inactive state when each of the control signal and the first signal is in the inactive state; and
a power gate transistor coupled between the internal circuit and the power supply terminal, and receiving the second signal at a gate electrode thereof.

13. The semiconductor device according to claim 12, wherein the power gate transistor includes a first conductive type transistor, the power supply control circuit further includes an additional power gate transistor which includes a second conductive type transistor, the additional power gate transistor receiving an inverted second signal at a gate electrode thereof.

14. A method comprising:
supplying a power supply voltage to an internal circuit when a power supply control signal is in active;
maintaining the supply of the power supply voltage to the internal circuit when an inactive state of the power supply control signal does not continue for a certain period; and
stopping the supply of the power supply voltage to the internal circuit when the inactive state of the power supply control signal continues for the certain period.

15. The method according to claim 14, wherein
when the power supply control signal transitions to an active state after the inactive state of the power supply control signal has maintained for the certain period of time or more followed by stopping the supply of the power supply to the internal circuit, the supply of the power supply to the internal circuit is resumed.

16. The method according to claim 14, wherein
the internal circuit includes a first circuit and a second circuit to both of which a first power supply and a second power supply are supplied when the power supply control signal is active; and
when the inactive state of the power supply control signal continues for the certain period of time or more, supply of the second power supply to the first circuit is stopped and supply of the first power supply to the first circuit is maintained, thereby maintaining an output node of the first circuit to have a same voltage as the first power supply, and supply of the first power supply to the second circuit is stopped and supply of the second power supply to the second circuit is maintained, thereby maintaining an output node of the second circuit to have a same voltage as the second power supply.

17. The method e according to claim 14, wherein
the internal circuit includes a plurality of internal circuits, and when the power supply control signal transitions from the inactive state to the active state and the supply of the power supply to the internal circuits is resumed after the inactive state of the power supply control signal has maintained for the certain period of time or more and the supply of the power supply to the internal circuits has been then stopped, the supply of the power supply is resumed, being time shifted with respect to the internal circuits, respectively.

* * * * *